(12) United States Patent
Kido

(10) Patent No.: US 7,727,365 B2
(45) Date of Patent: Jun. 1, 2010

(54) SUCTION PAD AND SUBSTRATE TREATMENT APPARATUS

(75) Inventor: Shigeru Kido, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 706 days.

(21) Appl. No.: 11/693,859

(22) Filed: Mar. 30, 2007

(65) Prior Publication Data
US 2007/0251817 A1 Nov. 1, 2007

(30) Foreign Application Priority Data
Apr. 28, 2006 (JP) ............................... 2006-125307

(51) Int. Cl.
*C25B 9/02* (2006.01)
(52) U.S. Cl. .................... 204/279; 204/198; 204/224 R; 204/278; 204/297.01; 204/297.03; 204/297.1; 204/297.14
(58) Field of Classification Search ................. 204/198, 204/224 R, 278, 279, 297.01, 297.03, 297.1, 204/297.14
See application file for complete search history.

(56) References Cited

U.S. PATENT DOCUMENTS

| 5,371,037 A | 12/1994 | Yonehara |
| 5,458,755 A | 10/1995 | Fujiyama et al. |
| 5,750,000 A | 5/1998 | Yonehara et al. |
| 5,951,833 A * | 9/1999 | Yamagata .................... 204/198 |
| 6,150,031 A | 11/2000 | Yonehara |
| 6,202,655 B1 | 3/2001 | Yamagata |
| 6,517,697 B1 | 2/2003 | Yamagata |
| 6,547,938 B1 * | 4/2003 | Matsumura et al. ......... 204/225 |
| 7,014,748 B2 * | 3/2006 | Matsumura et al. ......... 205/124 |
| 7,055,535 B2 * | 6/2006 | Kunisawa et al. ........... 134/157 |
| 2002/0050322 A1 * | 5/2002 | Kunisawa et al. ...... 156/345.11 |
| 2008/0048306 A1 * | 2/2008 | Stewart et al. .............. 257/684 |

FOREIGN PATENT DOCUMENTS

| JP | 2608351 | 2/1997 |
| JP | 3376258 | 11/2002 |

* cited by examiner

*Primary Examiner*—Bruce F Bell
(74) *Attorney, Agent, or Firm*—Fitzpatrick, Cella, Harper & Scinto

(57) ABSTRACT

A suction pad used for use in a substrate treatment apparatus which treats a substrate by immersing the substrate in a solution while the pad attaches to the substrate, including: a main face for attaching to the substrate; an outer face disposed along the outer periphery of the substrate; and a suction opening formed in the main face. In a cross-sectional shape including the main face and the outer face, the angle formed between a line corresponding to the main face and a line corresponding to the outer face is an acute angle.

6 Claims, 11 Drawing Sheets

SUCTION PAD AND SUBSTRATE TREATMENT APPARATUS

BACKGROUND OF THE INVENTION

1. Field of the Invention

The present invention relates to a suction pad for holding a substrate and a substrate treatment apparatus having the same, and in particular, to a suction pad for holding the peripheral part of the rear face of the substrate using vacuum suction so that the rear face of the substrate is not treated and a substrate treatment apparatus having the same.

2. Description of the Related Art

As a substrate treatment apparatus that treats only the front face side of the substrate so that the rear face of the substrate is not treated while the substrate is immersed in a solution, an anodizing apparatus is disclosed, for example, in Japanese Patent No. 3,376,258.

FIG. 5 is a schematic view of the anodizing apparatus illustrated in Japanese Patent No. 3,376,258. The anodizing apparatus has an anodization tank 108 for storing a HF solution 107, a holder 102 integrated with the anodization tank 108, and electrodes 106a and 106b disposed to the anodization tank 108 for anodizing a silicon substrate 101 by applying a voltage to the silicon substrate 101. An opening 103 is provided to the holder 102, a groove is provided to the holder 102 along the opening 103, and a suction pad 104 is fitted in the groove.

The suction pad 104 has a holding portion which attaches to a part of the rear face of the silicon substrate 101, a suction groove 104a whose cross-sectional shape is concave or U shaped, and a suction opening 105 for depressurizing the space in the suction groove to cause the substrate to attach.

In a substrate treatment using the anodizing apparatus, first, the silicon substrate 101 is immersed in a HF solution 107 while being subjected to vacuum suction with respect to the suction pad 104 via a pump (not shown) connected to the suction opening 105 through a line. To the silicon substrate 101 immersed in the HF solution 107, a current is flown by applying a voltage to the electrodes 106a and 106b. After that, upon finishing of the treatment of the silicon substrate 101 by the application of the voltage, the HF solution 107 is drained from the anodization tank 108, and then the silicon substrate 101 is exposed to the atmosphere. In order to allow the silicon substrate 101 to be taken out of the anodization tank 108, an inert gas such as nitrogen is poured in the line so as to break the vacuum atmosphere that caused the silicon substrate 101 to attach to the suction pad 104 via the suction opening 105. By this procedure, the anodization treatment of the silicon substrate 101 is completed.

Since the silicon pad 104 has the above-described shape and relationship with respect to the silicon substrate 101, even when the silicon substrate 101 is immersed in the HF solution 107, the HF solution 107 will be brought into contact with only the front face of the silicon substrate 101. Accordingly, this prevents the HF solution 107 from being brought into contact with the rear face of the silicon substrate 101. By applying a voltage to the electrodes 106a and 106b to flow a current in the silicon substrate 101, a porous layer is formed only on the front face of the silicon substrate 101, and is not formed on the rear face of the silicon substrate 101, because the HF solution 107 is not brought into contact with the rear face of the silicon substrate 101.

As illustrated in FIGS. 6A and 6B, during such a substrate treatment, in some cases, the HF solution 107 erroneously enters the line through the gap between the silicon substrate 101 and the suction pad 104. When vacuum is broken, the HF solution 107 that has entered the line will flow back in the vacuum suction line being pushed back by the inert gas. In this case, the flowing-back solution may further pass through the gap between the suction pad 104 and the silicon substrate 101 or the suction pad 104 and the holder 102 and spurts out near the end of the substrate. In particular, when the spurting part of the HF solution locates upper than the silicon substrate 101, the spurting HF solution 107 will come around to the front face of the silicon substrate 101 and then pass along and drop from the front face of the silicon substrate. Since many foreign materials comprised primarily of reaction by-products are contained in the solution which entered the vacuum suction line, if the solution passes along the face of the silicon substrate 101, the foreign materials may attach to and remain on the passage, or watermarks may be formed on the passage since liquid droplets remain and get dried on the front face of the substrate.

Moreover, in such a production method of a SOI wafer disclosed in U.S. Pat. No. 5,371,037, a SOI wafer is produced using a porous silicon layer formed by a method described in U.S. Pat. No. 6,517,697. Foreign materials as mentioned above may affect the quality of SOI wafers. For example, once a solution drawn into the vacuum suction line flows back and attaches to the produced porous silicon, foreign materials remain on the face of the porous silicon. As a result, since an epitaxial silicon layer is not formed on the position to which the foreign materials are attached, resulting in defect of a SOI wafer where a SOI layer is lacked. Such lack of the SOI layer, when device chips are produced, may cause malfunction of a circuit.

In other words, in order to reduce the foreign materials and watermarks on the face of the porous silicon, it has been required to prevent the solution that flows back from the vacuum suction line as mentioned above from coming around to the substrate front face.

The present invention is completed in view of the above problems, and, in a substrate treatment method for treating only the substrate face using a liquid chemical, the present invention provides a suction pad capable of preventing undesired foreign materials from attaching to the substrate face when the substrate is taken out, and a substrate treatment apparatus having the same.

SUMMARY OF THE INVENTION

A suction pad according to the present invention for use in a substrate treatment apparatus which treats a substrate by immersing the substrate in a solution while the pad attaches to the substrate, includes a main face for attaching to the substrate, an outer face disposed along the outer periphery of the substrate, and a suction opening formed on the main face, wherein, in a cross-sectional shape including the main face and the outer face, the angle formed between a line corresponding to the main face and a line corresponding to the outer face is an acute angle.

Meanwhile, a substrate treatment apparatus according to the present invention includes an anodization tank for storing a solution, a suction pad for attaching to a substrate, and a pump for applying a suction pressure to attach the substrate to the suction pad, wherein, the suction pad includes a main face for attaching to the substrate, an outer face disposed along the outer periphery of the substrate, and a suction opening formed on the main face, and the angle formed between a line corresponding to the main face and a line corresponding to the outer face in a cross-sectional shape containing the main face and the outer face is an acute angle.

Further features of the present invention will become apparent from the following description of exemplary embodiments with reference to the attached drawings.

DESCRIPTION OF THE EMBODIMENTS

Hereinafter, exemplary embodiments of the present invention will be described.

(A Suction Pad According to the Present Invention)

A suction pad according to the present invention for use in a substrate treatment apparatus which treats a substrate by immersing the substrate in a solution while the pad attaches to the substrate, includes a main face for attaching to the substrate, an outer face disposed along the outer periphery of the substrate, and a suction opening formed on the main face, wherein, in a cross-sectional shape including the main face and the outer face, the angle formed between a line corresponding to the main face and a line corresponding to the outer face is an acute angle.

Figure 1A:
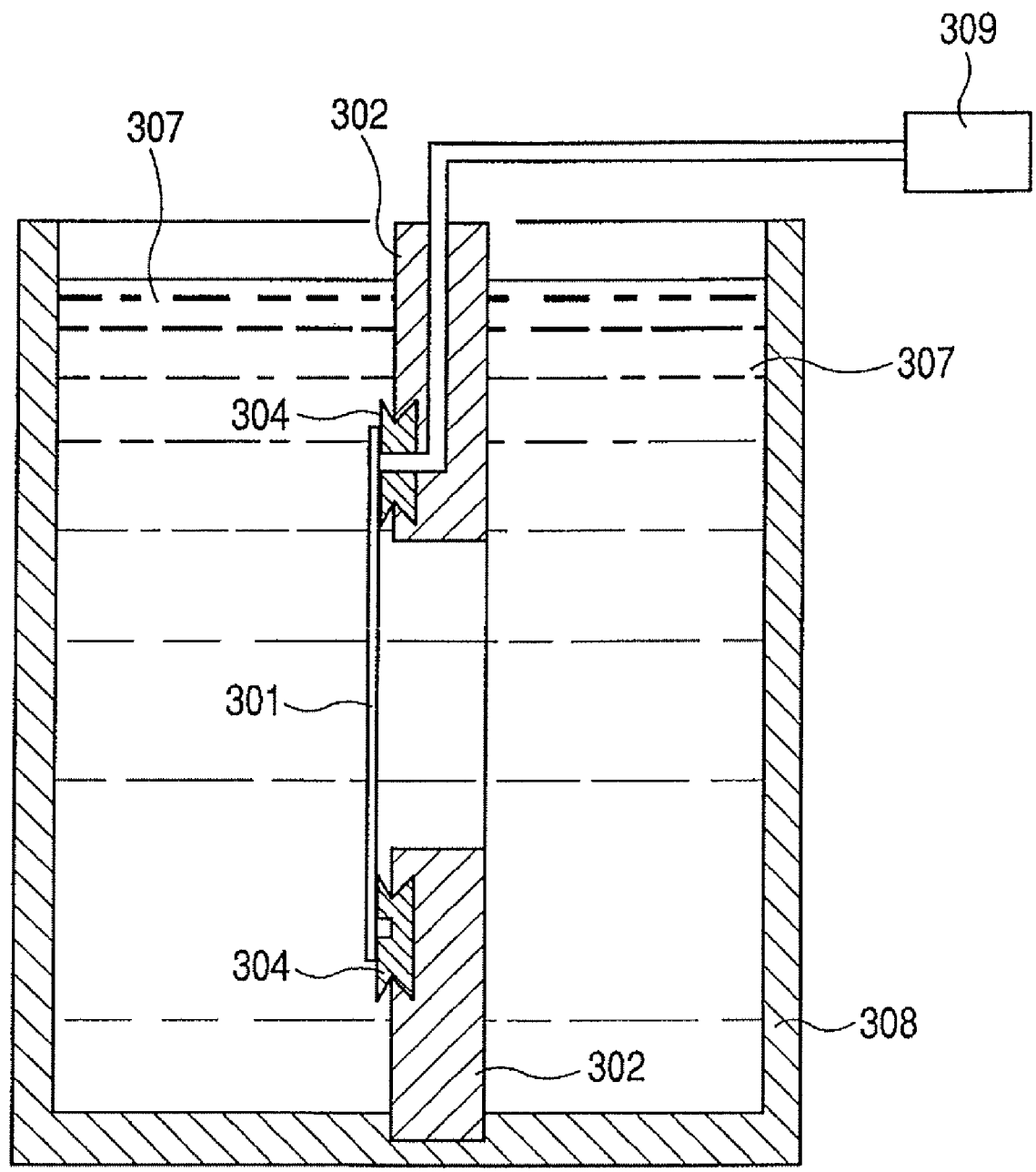
FIG. 1A is a schematic cross-sectional view of a substrate treatment apparatus according to the present invention.
Figure 1B:
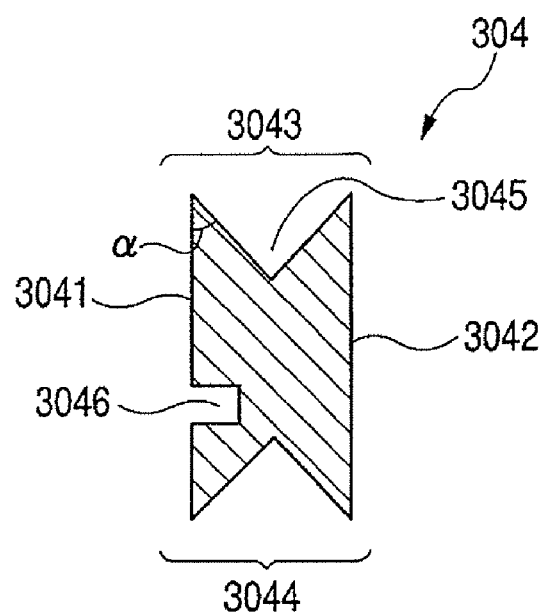
FIGS. 1BA and 1BB are longitudinal cross-sectional views of a suction pad according to the present invention.
Figure 1B:
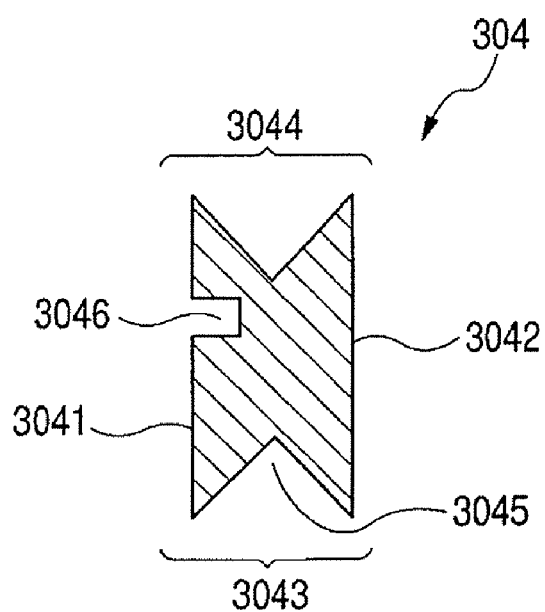

In FIG. 1A, a schematic view of a substrate treatment apparatus having a suction pad according to the present invention is illustrated, and in FIGS. 1BA and 1BB, longitudinal cross-sectional views of the suction pad according to the present invention are illustrated. First, by mainly referring to FIGS. 1BA and 1BB, the suction pad according to the present invention will be described in detail.

FIGS. 1BA and 1BB are longitudinal cross-sectional views including the central axis of a toroidal of the suction pad having a toroidal shape according to the present invention, and respectively illustrate the longitudinal cross-sectional view of the suction pad locating in a highest position with respect to the ground contact face and the longitudinal cross-sectional view of the suction pad locating in a lowest position with respect to the ground contact face.

As illustrated in FIGS. 1BA and 1BB, a suction pad 304 according to the present invention has a main face 3041 for attaching to a substrate 301, and an outer face 3043 disposed along the outer periphery of the substrate 301. The outer face 3043 of the suction pad 304, in a cross-sectional shape containing the main face 3041 and the outer face 3043, has such a shape that the angle formed between a line corresponding to the main face 3041 and a line corresponding to the outer face 3043 becomes an acute angle. In other words, the outer face 3043 has such a shape that an angle α described in FIG. 1BA becomes more than 0° and less than 90°. In particular, it is preferable for a suction pad which locates in upper positions with respect to the ground contact face to have the outer face 3043 so that α becomes within such a range. Since the suction pad 304 according to the present invention has such a shape, even if the solution which has erroneously entered a line flows back when vacuum atmosphere for attaching the substrate 301 to the suction pad 304 is broken, it is possible to prevent the solution from coming around to the front face side of the substrate 301. If α is equal to or less than 0°, the suction pad according to the present invention cannot have the outer face 3043, and if α is equal to or more than 90°, the above mentioned effect according to the present invention cannot be achieved.

If the suction pad according to the present invention has a shape formed along the outer periphery of the substrate 301, it is not limited in particular, and when the shape of the substrate 301 is, for example, circular, the suction pad has a toroidal shape. An example when the suction pad has a toroidal shape will be described below.

In the suction pad according to the present invention, the outer face 3043 preferably has a groove 3045. Moreover, the groove 3045 is preferably formed in the outer face 3043 in such a manner that the outer face 3043 faces upward from the ground contact face of the substrate treatment apparatus when the suction pad is mounted on the substrate treatment apparatus. Moreover, the groove 3045 is preferably formed throughout the entire region of the outer periphery of the suction pad. Since the suction pad according to the present invention has such a shape, the solution which has entered the line flows in the groove 3045 of the outer face 3043 to prevent the solution from coming around to the front face side of the substrate 301.

The suction pad according to the present invention has a suction opening 3046 communicating with a pump 309 for applying a suction pressure to the main face 3041 of the suction pad 304. The suction opening 3046 is preferably formed in the main face in such a manner that the cross-section corresponding to the suction opening is found out in a cross-sectional shape containing the main face 3041 and the outer face 3043. That is, the suction opening 3046 may be formed beltlike throughout the entire circumferential direction of the main face 3041. Since the suction pad has such a shape, it is possible to further increase the attaching force between the suction pad and the substrate.

Moreover, the suction opening 3046 may pass through from the main face 3041 to the rear face 3042. Furthermore, the suction pad according to the present invention may include a first member positioned along the periphery of the substrate 301 and a second member disposed to the inner periphery side of the first member via a gap. When such a suction pad including the first member and the second member is used, a line communicating with the pump for applying a suction pressure may be connected to the gap (corresponds to the suction opening 3046) formed between the first and second members. In this manner, by depressurizing such a gap, the substrate 301 and the suction pad 304 may be brought into close contact.

Furthermore, the outer periphery of the suction pad according to the present invention preferably has a size equal to or larger than the size of the outer periphery of the substrate. In other words, in the case of a circular substrate, if the outer periphery of a toroidal shape suction pad has such a size, the outer periphery of the toroidal shape suction pad will be disposed outside of the outer periphery of the substrate when the substrate is attached to the suction pad. By possessing such a shape, the suction pad according to the present invention can achieve the above mentioned effect, and enables to efficiently treat the face of the substrate.

Figure 2A:
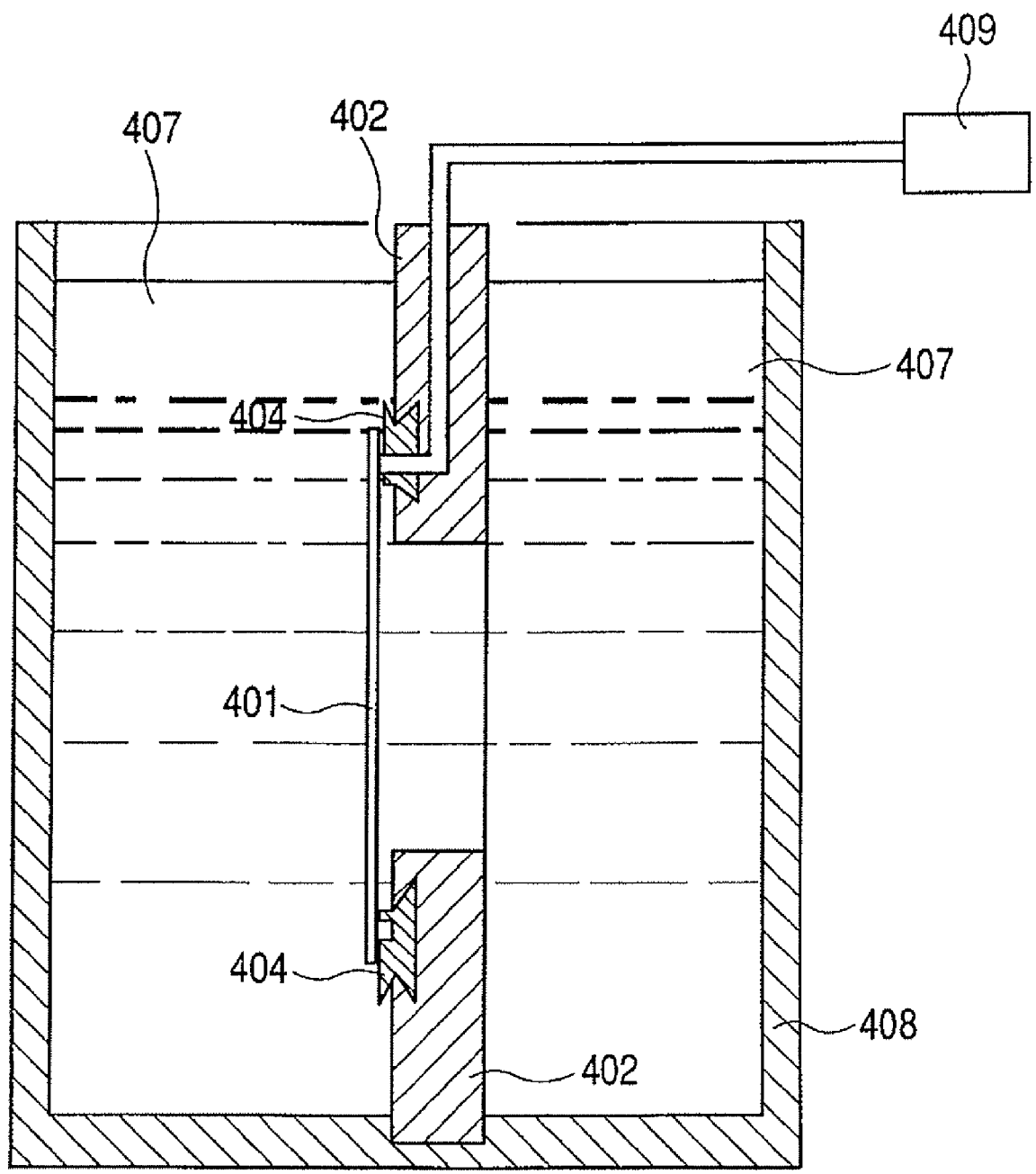
FIG. 2A is a schematic cross-sectional view of a substrate treatment apparatus according to the present invention.
Figure 2B:
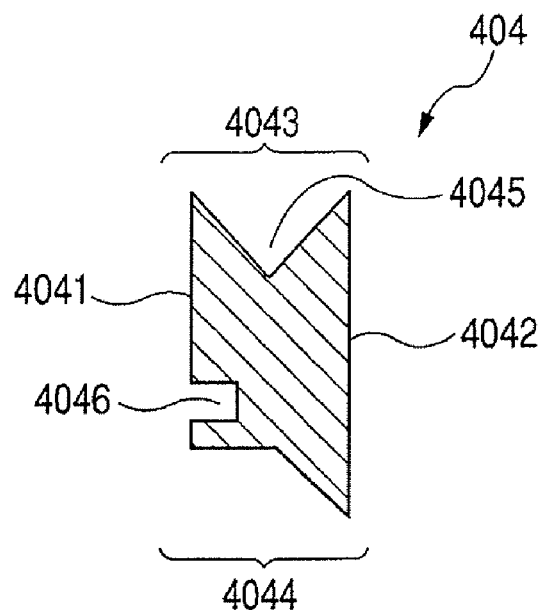
FIGS. 2BA and 2BB are longitudinal cross-sectional views of a suction pad according to the present invention.
Figure 2B:
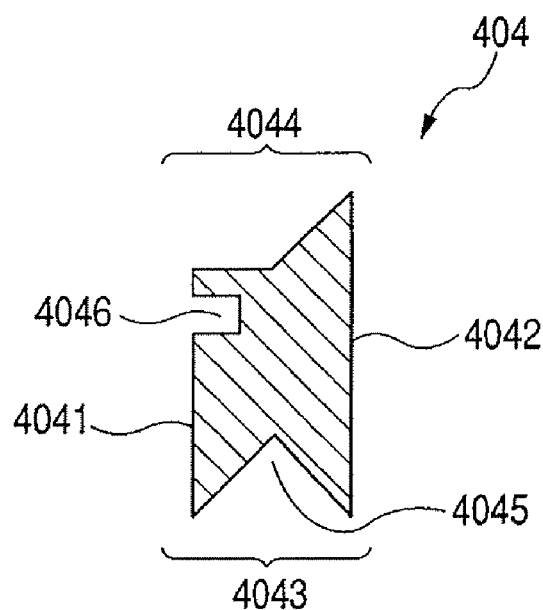

The shape of the suction pad according to the present invention is not particularly limited, if the suction pad is such a suction pad as mentioned above. In FIGS. 2BA, 2BB, 3BA, 3BB, 4BA and 4BB, modified examples of the suction pad described in FIGS. 1BA and 1BB are illustrated, and exemplary shapes of the longitudinal cross-sectional views of the suction pads according to the present invention are illustrated. In addition, these longitudinal cross-sectional views correspond to the longitudinal cross-sectional view described in FIGS. 1BA and 1BB mentioned above.

As for a suction pad 404 according to the present invention, for example, if an angle α formed between a main face 4041 and an outer face 4043 is more than 0° and less than 90°, the shape of an inner face 4044 is not limited. Moreover, as mentioned above, a suction opening 5046 may be formed so as to extend from the main face 5041 to a rear face 5042. Furthermore, as in a suction pad 604, if the shape of an outer face 6043 locating upward from the center face of the suction pad in parallel with the ground contact face satisfies $0°<\alpha<90°$ when the suction pad is mounted on the substrate treatment apparatus, the shape of the outer face 6043 locating downward from the center face is not limited in particular.

Although a material of the suction pad according to the present invention is not limited in particular, it is preferable to be a rubber material by considering such properties that the rubber material has resistance with respect to the solution (HF) used for an anodization process and can be efficiently brought into close contact with the substrate. As for such examples, for example, Viton® and Kalretz® are mentioned.

(A Substrate Treatment Apparatus According to the Present Invention)

The substrate treatment apparatus according to the present invention includes an anodization tank for storing a solution, a suction pad for attaching to a substrate, and a pump for applying a suction pressure (i.e. for reducing the internal pressure of a suction opening provided to the suction pad) to attach the substrate to the suction pad, wherein the suction pad includes a main face for attaching to the substrate, an outer face disposed along the outer periphery of the substrate, and a suction opening formed on the main face, and when the angle formed between a line corresponding to the main face and a line corresponding to the outer face in the cross-sectional shape containing the main face and the outer face is an acute angle.

FIG. 1A is a schematic cross-sectional view of a substrate treatment apparatus according to the present invention. The substrate treatment apparatus according to the present invention includes an anodization tank 308 for storing a solution 307 such as a hydrofluoric acid (hereinafter referred to as HF) solution, the above mentioned suction pad 304 for attaching to the substrate 301, and a pump 309 for applying a suction pressure to attach the substrate 301 to the suction pad 304.

The suction pad 304 may be fitted in a groove provided to a substrate holder 302. The substrate holder 302 may have a circular opening (in FIG. 1A, corresponding to a part between the upper substrate holder 302 and the lower substrate holder 302). The suction pad 304 is connected to the pump 309 through a line connected to the suction opening 3046 of the suction pad 304. In addition, the line is preferably sustainable with respect to vacuum pressure.

Next, the substrate treatment method of the substrate treatment apparatus according to the present invention will be described. The substrate 301 is attached to the suction pad 304 by means of a suction pressure applied by the pump 309 connected via the suction pad 304. The substrate 301 is held by the substrate holder 302 via the suction pad 304. The substrate 301 is immersed in a solution 307 while being in this state. The substrate 301 is treated, for example, by applying a voltage to electrodes (not shown) disposed to the wall of an anodization tank 308 so as to sandwich the substrate 301. After that, the solution 307 is drained from the anodization tank 308, and the attachment between the substrate 301 and the suction pad 304 is released. In this manner, the treatment of the substrate is completed.

In the present invention, the substrate 301 to be a subject of a substrate treatment is not limited in particular, however, in the above-mentioned anodization method, silicon, more preferably, single crystalline silicon is mentioned as an example. Regarding to the shape of the substrate, a disk shaped substrate, so called silicon wafer, is preferably used, which is used for a silicon device process.

In the present invention, the internal pressure of the suction opening for attaching the substrate 301 to the suction pad 304 is not limited in particular if the pressure is sufficient to attach the substrate 301 to the suction pad 304 even when a voltage is being applied in the solution 307 as mentioned above, however, the pressure is preferably to be substantially vacuum. In addition, if the pressure is enough to achieve the object, the pressure is not required to be as close to zero pressure as possible.

In the present invention, as "substrate treatment", for example, an anodization method is mentioned; however, it is not limited to the anodization method, in particular.

Making a silicon substrate to be porous by means of an anodization reaction, that is, a treatment for forming fine pores is performed, for example, in a HF solution. The anodization reaction progresses by disposing electrodes made of platinum in the solution on each of the front face side and the rear face side of the substrate, and flowing a current between both electrodes so that the front face side of the substrate becomes an anode, and then a porous layer is formed on the front face side of the substrate.

As treatments other than the anodization, electroplating and etching are mentioned; however, they are preferably used when only the front face of the substrate is selectively treated.

With regard to a method for releasing the attachment between the substrate and the suction pad, a method for supplying a gas such as an inert gas from a supply line preliminarily connected to a line connecting the suction pad and the pump to restore the pressure in the supply line may be used. The gas to be supplied is not limited in particular; it may be nitrogen or otherwise may be oxygen, air, argon or helium. Moreover, a method of placing a substrate being attached to the suction pad in the atmosphere to release vacuum may be used.

Figure 3A:
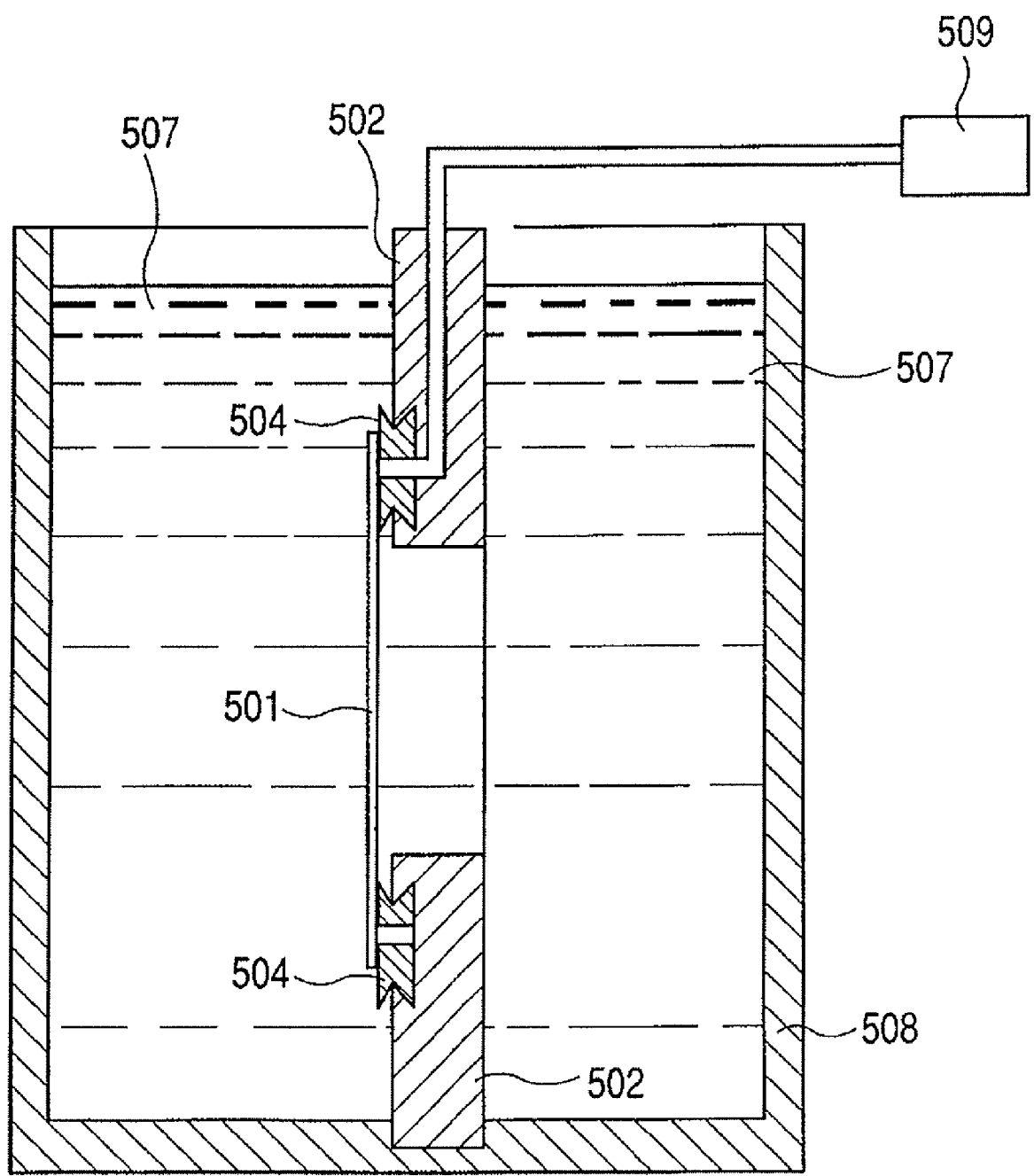
FIG. 3A is a schematic cross-sectional view of a substrate treatment apparatus according to the present invention.
Figure 4A:
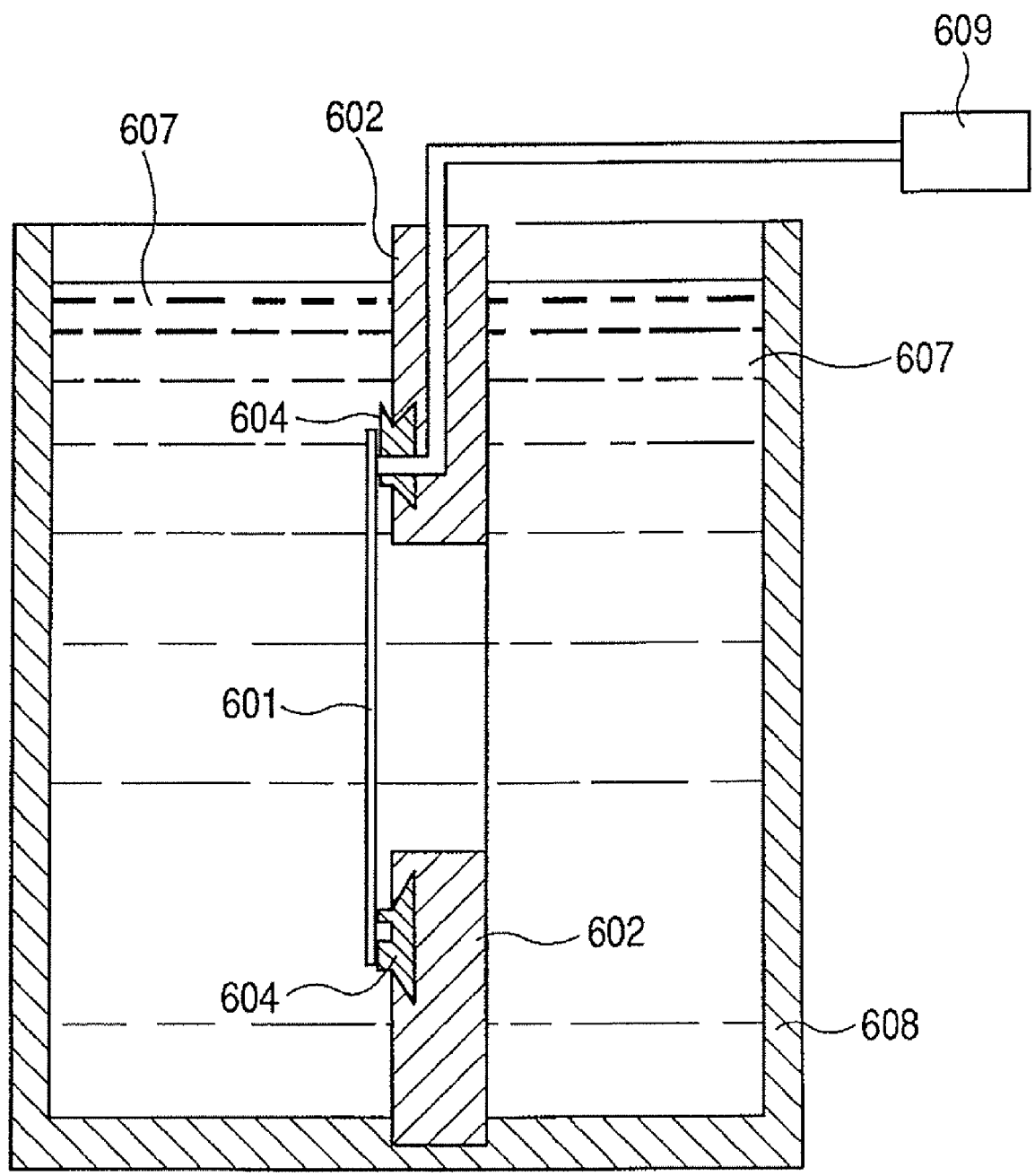
FIG. 4A is a schematic cross-sectional view of a substrate treatment apparatus according to the present invention.
Figure 4B:
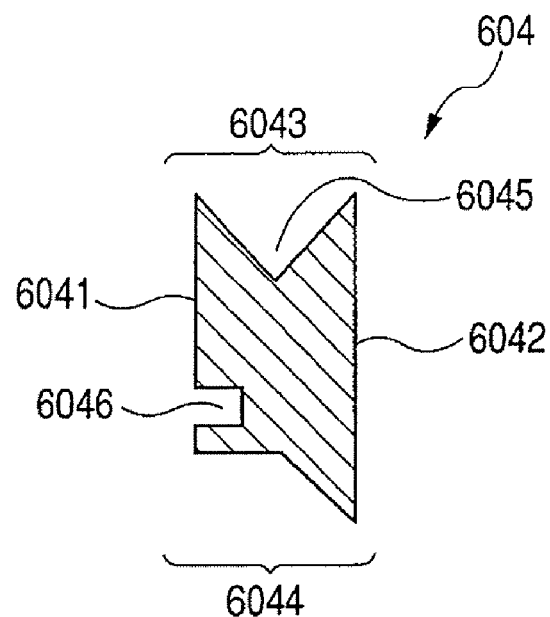
FIGS. 4BA and 4BB are longitudinal cross-sectional views of a suction pad according to the present invention.
Figure 4B:
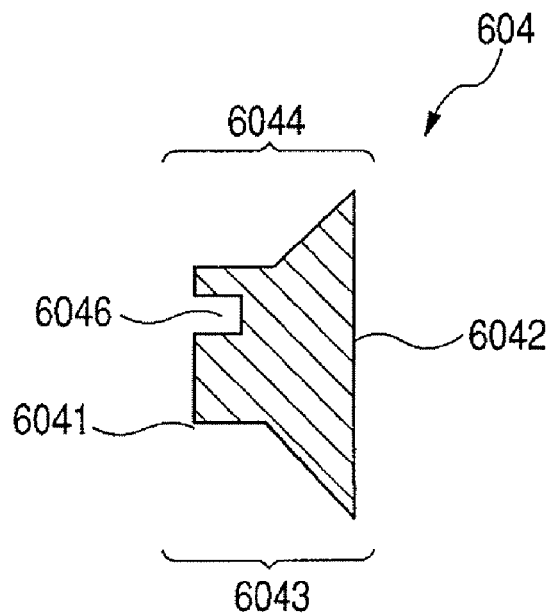
Figure 5:
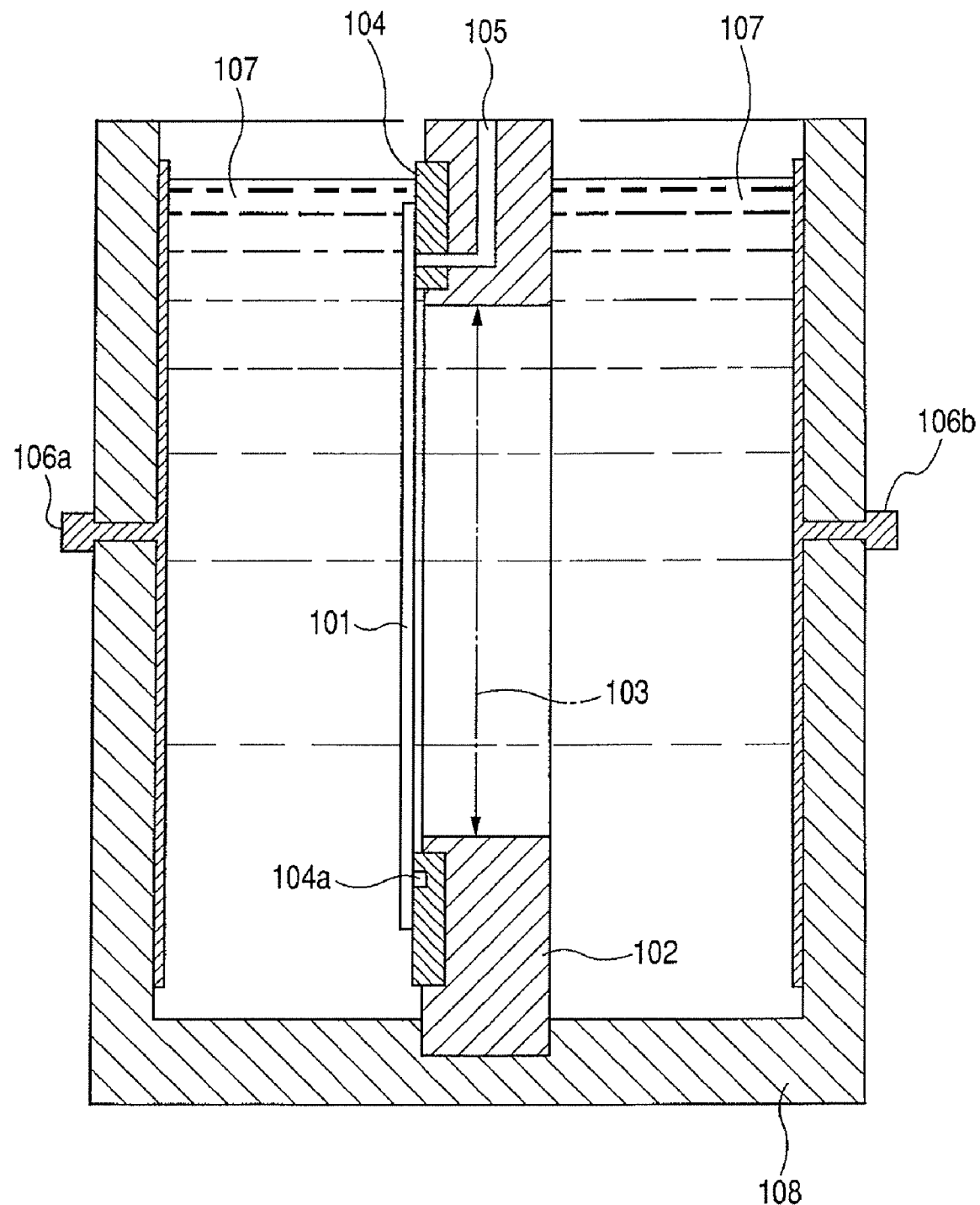
FIG. 5 is a schematic view of a substrate treatment apparatus shown in Japanese Patent No. 3,376,258.

The substrate treatment apparatus according to the present invention, if it has such aspects, is not limited in particular. FIGS. 2A, 3A and 4A are schematic cross-sectional views illustrating examples of the substrate treatment apparatus according to the present invention. In addition each component constituting these substrate treatment apparatuses has the same function as the component mentioned above.

EXAMPLES

Example 1

Figure 3B:
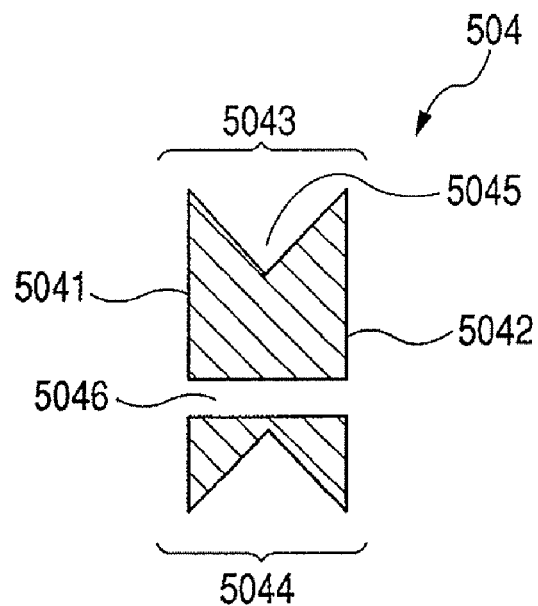
FIGS. 3BA and 3BB are longitudinal cross-sectional views of a suction pad according to the present invention.
Figure 3B:
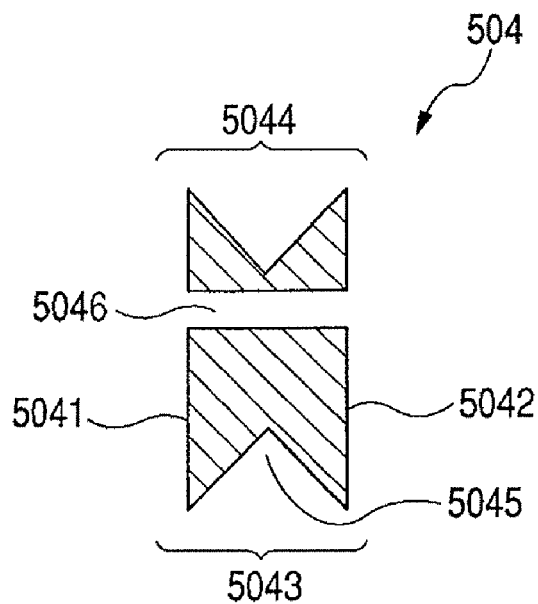

An example of the present invention will be described using FIGS. 3BA and 3BB.

A silicon wafer where the size of a substrate 501 is 200 mm is attached to a suction pad 504 fitted in a substrate holder 502 in an anodization tank 508. The suction pad 504 is connected to a pump 509 using a pipe where the pressure can be reduced. The suction pad 504 has the following sizes.

Inner diameter of the suction pad 504: 186 mm $\phi$, Outer diameter of the suction pad 504: 205 mm $\phi$, Thickness of the suction pad 504: 4.4 mm, Width of a suction opening formed in the suction pad 504 along the contour of the substrate 501 in order to attach to the substrate 501: 1.5 mm, Depth of the suction opening: 0.7 mm, and Diameter of a hole placed uniformly in a circumferential direction, connecting the suction opening and the pump, and passing through the suction pad to the rear face: 0.5 mm.

At least one concave portion of the side face outside the substrate is provided, and one concave portion is provided at a position of 1.1 mm from the side attaching to the rear face of the substrate in the thickness direction, and at the same time one concave portion is also provided at the same position of the side face inside the substrate (FIGS. 1BA and 1BB).

The attaching position of the substrate 501 to the suction pads 504 is arranged so that the central line of the substrate 501 and the central line of the suction pad 504 are on the same line. While being arranged in such a manner, by applying a suction pressure using the pump 509, the substrate 501 and the suction pad 504 are held.

By supplying a solution 507 composed of HF and alcohol into the anodization tank 508, immersing the substrate 501 in the solution 507, and subsequently applying 5 A DC current and 10 A DC current for three minutes and one minute, respectively, in this order, a porous silicon layer is formed on the face of the substrate 501.

After that, the solution 507 is drained from the anodization tank 508, and the substrate 501 is exposed to the atmosphere. Further, in order to detach the substrate from the suction pad 504, the vacuum suction by the pump 509 is stopped, and nitrogen gas is poured in the pipe. During pouring the nitrogen gas, the substrate 501 was visually observed, and then it was observed that liquid droplets flowing back from the pipe came out from the gap between the suction pad 504 on the upper side of the substrate 501 and the substrate holder 502. However, the liquid droplets flew and dropped downward through the groove 5045 formed on the outer face 5043 of the suction pad 504 without flowing to the front face of the substrate 501.

The substrate 501 taken out of the anodization tank 508 was rinsed in a water washing tank (not shown) and subsequently dried by means of a spin drying process. When such a wafer was observed using a laser scattering foreign material inspection system SP1 (made by KLA-Tencor company), the number of the observed foreign materials was three, and they seemed not being localized.

Comparative Example

Figure 6A:
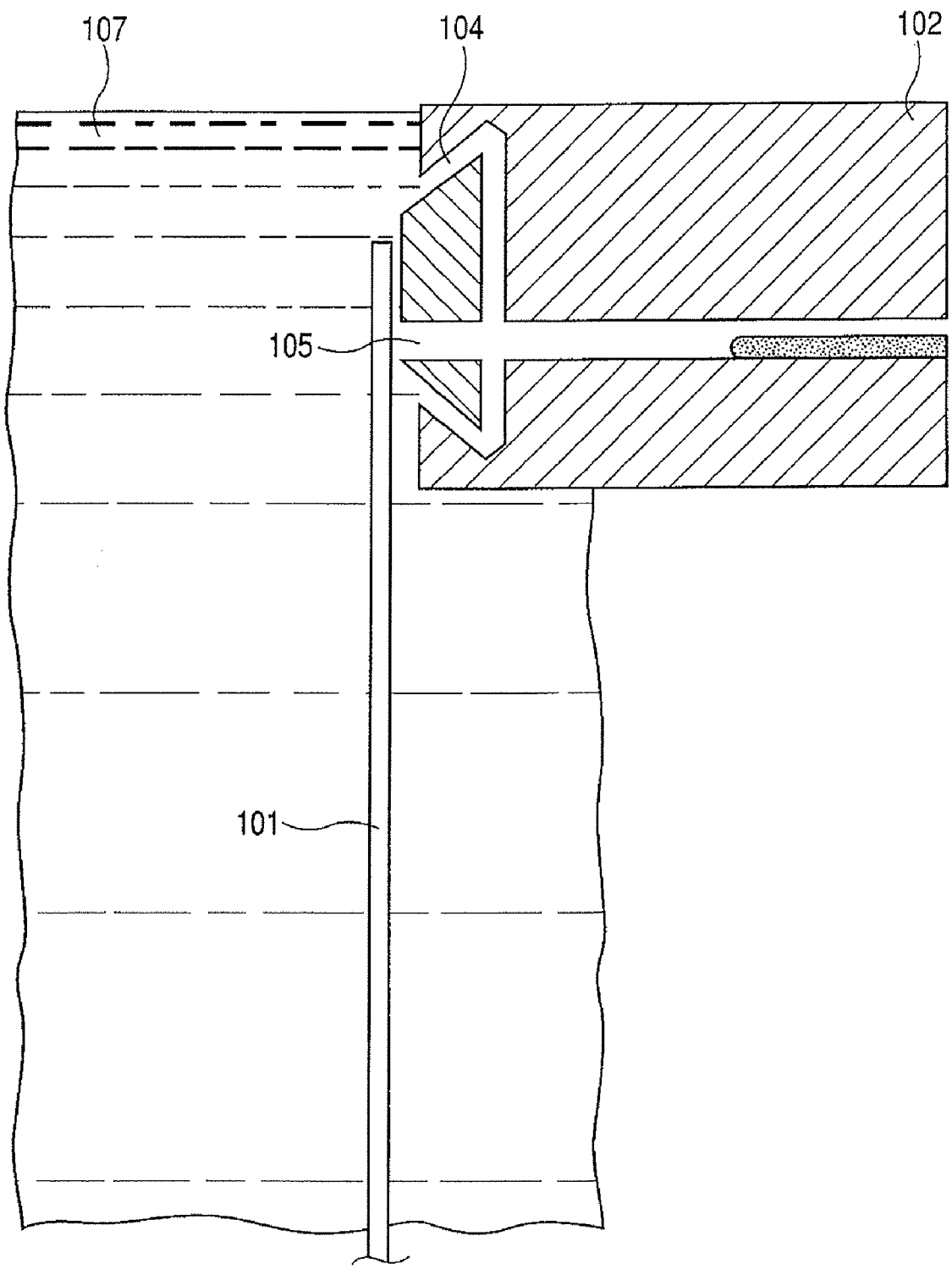
FIG. 6A is a view illustrating a problem of a prior art.
Figure 6B:
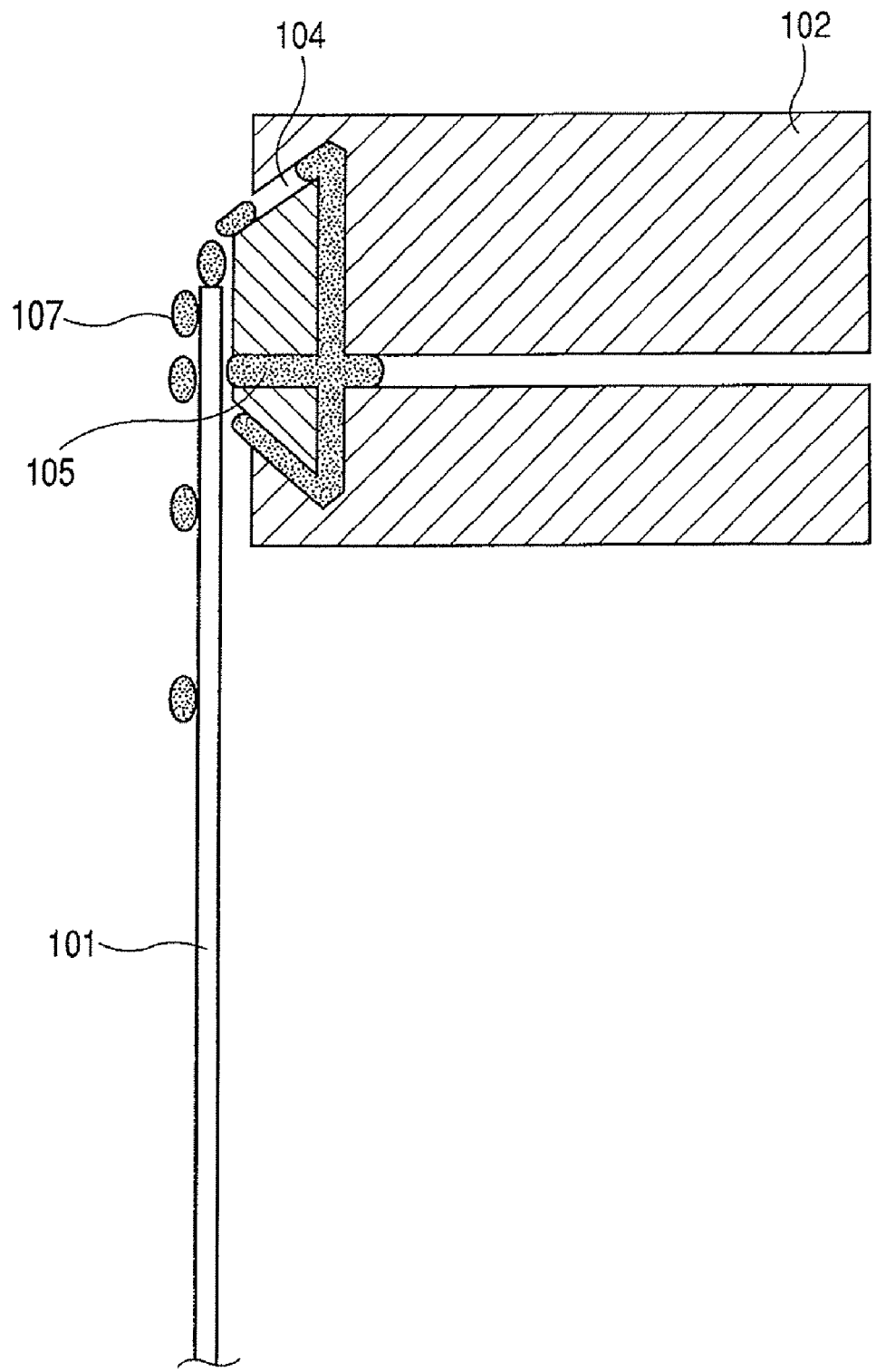
FIG. 6B is a view illustrating a problem of a prior art.

As a comparison, using a pad having a shape where a groove was not provided to the side face of the pad (FIG. 6A), a porous silicon layer was formed in the same way. When 10 pieces of substrates were treated, it was observed in two pieces of substrates that liquid droplets flew over the substrate face upon introduction of nitrogen gas in the pipe in order to release the substrates from the suction pad. When such substrates were observed using the above SP1 apparatus, the number of foreign materials in substrates for which flowing of liquid droplets was not observed was 1 to 8; on the contrary, the number of foreign materials in substrates for which flowing of liquid droplets was observed was 42 and 87 respectively. Most of the increased foreign materials were aligned in a manner of linked chain on the positions corresponding to the passage of the liquid droplet flow.

Using such substrates, according to the method described in Japanese Patent No. 2,608,351, SOI wafers with a SOI film thickness of 70 nm were produced. Among the produced SOI wafers, for 200 pieces of them, the pads according to the present embodiment were used, while for 195 pieces of them, the pads of the comparative example were used. These SOI wafers were observed using the above SP1 apparatus. As the results, the average number of foreign materials whose size are equal to or larger than the size corresponding to the polystyrene particle with a diameter of 1 $\mu$m, corresponding to a foreign material where the SOI layer was lacked, was five in the SOI wafers using the pad according to the present invention, on the contrary, it was 40 in the SOI wafers using the pad of the comparative example. Accordingly, when the suction pads according to the present invention were used, the number of the foreign materials was significantly decreased.

Second Example

A silicon wafer where the size of a substrate size was 200 mm and suction pads with the following sizes were used.

Inner diameter of the suction pad: 186 mm $\phi$, Outer diameter of the suction pad: 205 mm $\phi$, Thickness of the suction pad: 4.4 mm, Width of a suction opening formed in the suction pad along the contour of the substrate in order to attach to the substrate: 1.5 mm, and Depth of the suction opening: 0.7 mm.

At least one concave portion of the side face outside the substrate is provided, and one concave portion is provided at a position of 1.1 mm from the side attaching to the rear face of the substrate in the thickness direction.

The attaching position of the substrate to the suction pad is arranged so that the central line of the substrate and the central line of the suction pad are on the same line. By recovering the solution consisting primarily of HF from the anodization tank, and after the substrate face is exposed to the atmosphere from the solution, in order to detach the substrate, for example, an inert gas was poured.

Third Example

A silicon wafer where the size of a substrate is 200 mm is used. Moreover, suction pads made of Viton® and having two toroidal members with the following sizes (a member placed at the far side from the center of the substrate is referred to as an outer member, and a member placed at the near side from the center of the substrate is referred to as an inner member) are used.

Inner diameter of the outer member: 198 mm $\phi$, Outer diameter of the outer member: 205 mm $\phi$, and Thickness of the outer member: 4.4 mm.

At least one concave portion of the side face outside the substrate is provided, and one concave portion is provided at a position of 1.1 mm from the side attaching to the rear face of the substrate in the thickness direction.

Inner diameter of the inner member: 186 mm $\phi$, Outer diameter of the inner member: 196 mm $\phi$, and Thickness of the inner member: 4.4 mm.

The attaching position of the substrate to the suction pad is arranged so that the central line of the substrate and the central line of the suction pad are on the same line. By recovering the solution consisting primarily of HF from the anodization tank, and after the substrate face is exposed to the atmosphere from the solution, in order to detach the substrate, for example, an inert gas was poured.

Fourth Example

A silicon wafer where the size of a substrate is 200 mm and suction pads made of Viton® with the following sizes are used.

Inner diameter of the suction pad: 186 mm φ, Outer diameter of the suction pad: 205 mm φ, Thickness of the suction pad: 4.4 mm, Width of a suction opening formed in the suction pad along the contour of the substrate for attaching the suction pad to the substrate: 1.5 mm, and Depth of the groove: 0.7 mm.

At least one concave portion of the side face outside the substrate is provided, and one concave portion is provided at a position of 1.1 mm from the side attaching to the rear face of the substrate in the thickness direction, and the concave portion is provided to only the upper semicircle of the substrate.

The attaching position of the substrate to the suction pad is arranged so that the central line of the substrate and the central line of the suction pad are on the same line. By recovering the solution consisting primarily of HF from the anodization tank, and after the substrate face is exposed to the atmosphere from the solution, in order to detach the substrate, for example, an inert gas was poured.

According to the present invention, it is possible to prevent undesired foreign materials and watermarks from attaching to the face of a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-125307, filed on Apr. 28, 2006, which is hereby incorporated by reference herein in its entirety.

What is claimed is:

1. A suction pad for use in a substrate treatment apparatus which treats a substrate by immersing the substrate in a solution while the pad attaches to the substrate, comprising:
    a main face for attaching to the substrate;
    an outer face disposed along the outer periphery of the substrate; and
    a suction opening formed in the main face,
    wherein, in a cross-sectional shape including the main face and the outer face, the angle formed between a line corresponding to the main face and a line corresponding to the outer face is an acute angle.

2. The suction pad according to claim 1, wherein the outer face includes a groove.

3. The suction pad according to claim 1, wherein the suction opening is formed so that a cross-section corresponding to the suction opening is found out in any of the cross-sectional shape.

4. The suction pad according to claim 1, wherein the suction opening passes through the suction pad to the rear face of the suction pad.

5. The suction pad according to claim 1, wherein the suction pad has an outer periphery having a size equal to or larger than the size of the outer periphery of the substrate.

6. A substrate treatment apparatus, comprising:
    an anodization tank for storing a solution;
    a suction pad for attaching to a substrate; and
    a pump for reducing an internal pressure of a suction opening provided to the suction pad to attach the substrate to the suction pad, wherein the suction pad comprises:
    a main face for attaching to the substrate;
    an outer face disposed along the outer periphery of the substrate; and
    a suction opening formed on the main face, and
    wherein the angle formed between a line corresponding to the main face and a line corresponding to the outer face in a cross-sectional shape including the main face and the outer face is an acute angle.

* * * * *